(12) United States Patent
Shibata et al.

(10) Patent No.: US 6,703,649 B2
(45) Date of Patent: Mar. 9, 2004

(54) SEMICONDUCTOR ELEMENT

(75) Inventors: Tomohiko Shibata, Kasugai (JP); Keiichiro Asai, Nagoya (JP); Osamu Oda, Nishikasugai-gun (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/147,047

(22) Filed: May 17, 2002

(65) Prior Publication Data
US 2002/0179932 A1 Dec. 5, 2002

(30) Foreign Application Priority Data
May 31, 2001 (JP) ......................................... 2001-163592

(51) Int. Cl.[7] ......................................... H01L 31/0328
(52) U.S. Cl. ..................... 257/194; 257/183; 257/77; 257/615
(58) Field of Search ................................ 257/194, 197, 257/77, 192, 191, 615, 183

(56) References Cited

U.S. PATENT DOCUMENTS 6,177,688 B1 * 1/2001 Linthicum et al. ............ 257/77
6,497,763 B2 * 12/2002 Kub et al. ..................... 117/94
2002/0113249 A1 * 8/2002 Hori et al. .................. 257/194

FOREIGN PATENT DOCUMENTS

EP      1 213 767 A2   6/2002
JP      P2000-68498 A  3/2000

OTHER PUBLICATIONS

Applied Physics Letters, vol. 67, No. 3, pp. 401–403, Jul. 1995.*

* cited by examiner

Primary Examiner—Mark V. Prenty
(74) Attorney, Agent, or Firm—Oliff & Berridge, PLC

(57) ABSTRACT

A semiconductor element includes a conductive SiC base having a resistivity of less than $1 \times 10^5$ Ωcm, an underlayer made of a semiconductor nitride including at least Al element which is formed on the SiC base, and a semiconductor nitride layer group made including at least one of Al element, Ga element and In element.

15 Claims, 1 Drawing Sheet

SEMICONDUCTOR ELEMENT

BACKGROUND OF THE INVENTION

1. Field of the Invention

This invention relates to a semiconductor element, particularly usable for a field-effect transistor (FET), a high electron mobility transistor (HEMT), a heterojunction bipolar transistor (HBT) or the like.

2. Related Art Statement

With the recent development of cellular phone technique and optical communication technique, low electric power consumable and high output electron devices having high frequency performance are remarkably desired. Also, with the recent development of energy saving, large electric power electron devices having large voltage-resistance are remarkably desired. As such an electron device, conventionally, a Si device and a GaAs device have been employed. However, since these device can not exhibit adequate performances as such an electron device, another suitable electron device is keenly desired as the electron device.

In this point of view, a HEMT and a psudemorphic HEMT which are made of GaAs-based semiconductors have been developed and practically used. Moreover, a high performance electron device such as a HEMT and a HBT made of InP-based semiconductor have been actively researched and developed.

However, such a high performance electron device is composed of plural semiconductor layers epitaxially grown on a given substrate, and has a much complicated structure. Moreover, micro processing technique is required in fabricating the electron device, so that the manufacturing cost of the electron device rises. In addition, the InP-based semiconductor is very expensive, so that alternatives are desired.

In this point of view, recently, much attention is paid to a new electron device made of a GaN-based semiconductor. Since the bandgap of the GaN semiconductor is 3.39 eve, the GaN semiconductor can have a dielectric breakdown voltage tenfold as large as that of GaAs semiconductor and Si semiconductor. Moreover, since the GaN semiconductor can have a large electron saturated drift velocity, it can have a larger performance index as an electron device than the GaAs semiconductor and the Si semiconductor. Therefore, the GaN semiconductor is prospected as a fundamental semiconductor for a high temperature device, a high output device and a high frequency device in engine controlling technique, electric power converting technique and mobile communication technique.

Even though such an electron device is made of the GaN-based semiconductor, however, the designed performance index of the electron device can not be realized.

SUMMARY OF THE INVENTION

It is an object of the present invention to provide a semiconductor element usable as such an electron device which can exhibit a large performance index designed and an epitaxial substrate preferably usable for the semiconductor element.

In order to achieve the above object, this invention relates to a semiconductor element including a conductive SiC base having a resistivity of less than $1 \times 10^5$ $\Omega$cm, an underlayer made of a semiconductor nitride including at least Al element which is formed on the SiC base, and a semiconductor nitride layer group made including at least one of Al element, Ga element and In element.

This invention also relates to an epitaxial substrate including a conductive SiC base having a resistivity of less than $1 \times 10^5$ $\Omega$cm, and an underlayer made of a semiconductor nitride including at least Al element which is formed on the SiC base.

The inventors had intensely researched the cause that an electron device made of a GaN-based semiconductor can not exhibit the designed performance index and thus, can not realize a sufficient output performance and a high frequency performance. As a result, they found out the following fact of the matter.

Although a conventional electron device is made of a GaN-based semiconductor layer group which is formed on a given substrate, as of now, a sapphire single crystal substrate is employed because it is not expensive. However, the thermal conductivity of the sapphire single crystal substrate is much lower than that of any other single crystal substrate. Therefore, a heat generated during the use of the electron device can not be radiated sufficiently and stored in the electron device. As a result, the physical properties of the semiconductor layer group is shifted from the originally designed physical properties, and thus, the electron device can not exhibit the desired performance index.

In this point of view, the inventors have made an attempt to practically use a SiC substrate as a new substrate material instead of the sapphire single crystal substrate. Since the SiC substrate has a large thermal conductivity, the performance index of an electron device constructed of the SiC substrate is not degraded due to the thermal storage.

However, the kind and the amount of impurity contained in the SiC substrate fluctuates due to the fabricating method, and thus, the conductive property of the SiC substrate fluctuates largely. Normally, an insulative and low conductive SiC substrate is expensive because the fabricating process becomes complicated. Therefore, an electron device constructed of such an insulative SiC substrate is also expensive, and is not suitable for mass-production.

On the other hand, since a conductive SiC substrate can be easily fabricated, it is not expensive and suitable for mass-production. Therefore, the fabricating cost of electron device can be lowered if the electron device is constructed of the conductive SiC substrate. However, the high frequency performance of the electron device may be deteriorated due to the conductivity of the SiC substrate, and thus, the conductive SiC substrate can not be practically employed for the electron device, as of now.

In this point of view, the inventors had made an attempt to practically use the conductive SiC substrate not expensive. As a result, if an underlayer is made of an Al-including semiconductor nitride on the conductive SiC substrate and then, a given semiconductor layer group functioning as a semiconductor element is formed on the underlayer, the deterioration of the thus obtained electron device can be repressed due to the large insulation of the underlayer.

In the present invention, the above-mentioned semiconductor layer group is required to be a semiconductor nitride layer group including at least one of Al element, Ga element and In element. The requirement is originated from the large performance index and the epitaxial growth of the semiconductor layer group on the underlayer.

The present invention can be applied for various semiconductor device, particularly usable for an electron device such as a FET, a HEMT and a HBT.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
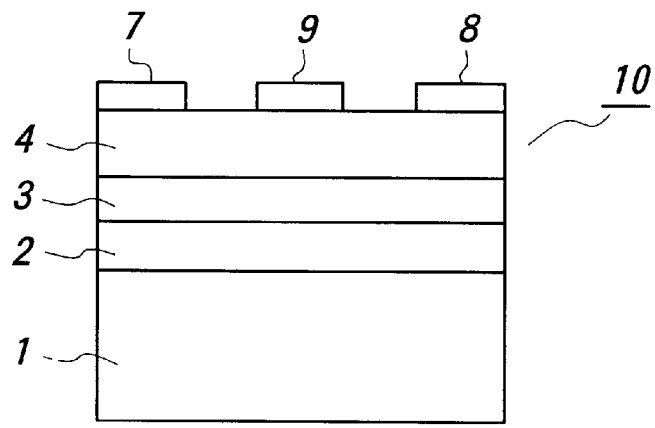
FIG. 1 is a structural view showing a FET made of a semiconductor device according to the present invention.

This invention will be described in detail, hereinafter. In the present invention, it is required that a conductive SiC base having a resistivity of less than $1 \times 10^5$ Ωcm is employed. As mentioned above, the conductive SiC base is not expensive, and thus, the fabricating cost of semiconductor element constructed of the conductive SiC base can be lowered. Therefore, the thus obtained semiconductor element is suitable for mass-production.

According to the present invention, a conductive SiC base having a resistivity of $1 \times 10^2$ Ωcm or below may be employed by utilizing the underlayer made of Al-including semiconductor nitride which will be described hereinafter.

In the present invention, it is required that the underlayer is made of Al-including semiconductor nitride. Since the semiconductor nitride has a large insulation, the deterioration of the high frequency performance of the thus obtained semiconductor element can be repressed by setting off the conductivity of the SiC base.

In order to enhance the insulation of the underlayer for the conductive SiC base, the thickness of the underlayer is preferably set to 0.5 μm or over, particularly 2 μm or over.

The upper limited value of the underlayer is not restricted, but preferably set to 100 μm. In this case, a stress generated in the semiconductor element is reduced, so that the warping degree of the semiconductor element is reduced and the exfoliation of the underlayer is prevented.

The thickness of the underlayer is appropriately set within the above-mentioned preferable range dependent on required device properties such as the high frequency performance, the electric strength and the thermal resistance of the semiconductor element.

The underlayer is preferably made at 1100° C. or over, particularly 1200° C. or over by means of a CVD method such as a MOCVD method or a HVPE method. Conventionally, since an underlayer is made at a temperature within 500–700° C., it is turned out that the above-mentioned temperature range is much higher than the conventional temperature range.

The underlayer is preferably made at 1250° C. or below by means of a CVD method. In this case, the surface roughness of the underlayer due to the composition and the diffusion of the constituent elements in the underlayer can be repressed effectively. Herein, the above-mentioned temperature range are defined using the temperature of the SiC base itself during underlayer growth.

The insulation of the underlayer for the conductive SiC base is increased as the Al content of the underlayer is increased. In this point of view, the Al content of the underlayer is preferably set to 50 atomic percentages or over for all of the III elements, and particularly the underlayer is made of AlN (100 atomic percentages of Al content).

As mentioned above, the underlayer includes Al element and the semiconductor nitride layer group includes at least one of Al element, Ga element and In element. Therefore, the difference in lattice constant between the underlayer and the semiconductor nitride layer group may be increased, and thus, some cracks may be created in the underlayer and the semiconductor nitride layer group.

In this case, it is desired that the composition of the underlayer is varied continuously or stepwisely toward the semiconductor nitride layer group from the conductive SiC base so that the composition of the underlayer is set almost equal to the composition of the nitride semiconductor layer group at the boundary surface therebetween. Thereby, a stress generated by the difference in lattice constant between the underlayer and the semiconductor nitride layer group is mitigated, so that the creation of crack can be prevented.

In the semiconductor element of the present invention constructed of the above-mentioned underlayer and semiconductor nitride layer group, the warping degree can be reduced to 100 μm or below per 5 cm length. Therefore, a remaining stress in the semiconductor element can be almost removed, and the destruction and the property change of the semiconductor element can be prevented during the long time use.

The underlayer may contain Ga element and/or In element in addition to Al element. In order to enhance the insulation, the underlayer may contain another element such as a transition metal which form the deep impurity level in the underlayer. Also, the underlayer may contain still another element such as Mg element, Si element or B element as occasion demands as well as Al element, Ga element and In element.

The underlayer and the semiconductor layer group may be made by means of well known film-forming means.

FIG. 1 is a structural view showing a FET made of the semiconductor element of the present invention.

A FET 10 illustrated in FIG. 1 includes a conductive SiC base 1, an AlN underlayer 2 epitaxially grown on the SiC base 1, and an i-GaN layer 3 and an n-GaN layer 4 which are epitaxially grown on the underlayer 2 in turn. In this embodiment, the i-GaN layer 3 and the n-GaN layer 4 are classified in a semiconductor nitride layer group. On the n-GaN layer 4 are provided a source electrode 7 and a drain electrode 8 which are made of a Ti/Al/Pt/Au multilayered structure and have ohmic-contact property and a gate electrode 9 which is made of a Ni/Pt/Au multilayered structure and has Schottky-contact property.

Figure 2:
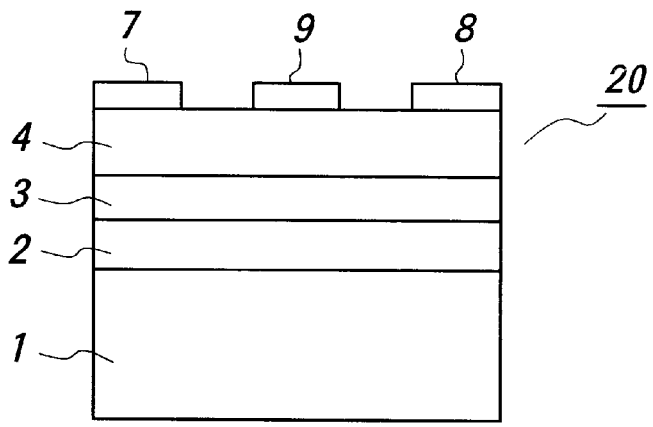
FIG. 2 is a structural view showing a HEMT made of a semiconductor device according to the present invention.

FIG. 2 is a structural view showing a HEMT made of the semiconductor element of the present invention. Fundamentally, a HEMT illustrated in FIG. 2 has a similar configuration to the FET 10 illustrated in FIG. 1.

The HEMT 20 illustrated in FIG. 2 includes a conductive SiC base 1, an AlN underlayer 2 epitaxially grown on the SiC base 1, and an i-GaN layer 3 and an n-AlGaN layer 4 which are epitaxially grown on the underlayer 2 in turn. In this embodiment, the i-GaN layer 3 and the n-AlGaN layer 4 are classified in a semiconductor nitride layer group. On the n-AlGaN layer 4 are provided a source electrode 7, a drain electrode 8 and a gate electrode 9 which are made of the similar multilayered structures to the ones in the FET 10 shown in FIG. 1.

Figure 3:
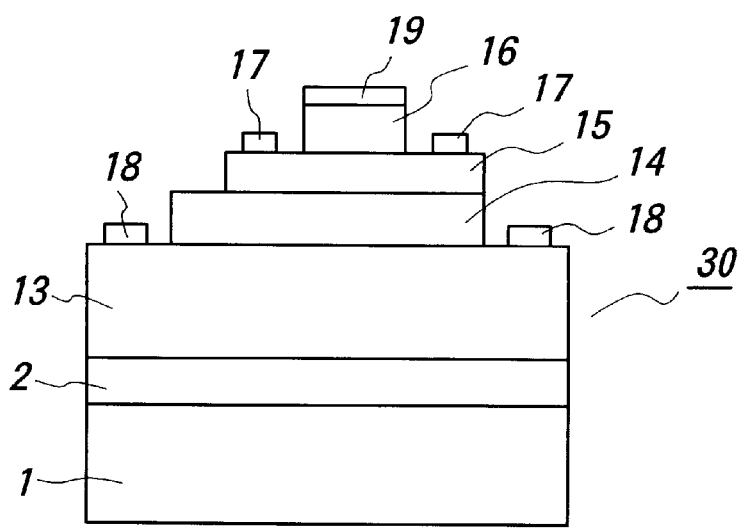
FIG. 3 is a structural view showing a HBT made of a semiconductor device according to the present invention.

FIG. 3 is a structural view showing a HBT made of the semiconductor element of the present invention. The same numerals are given to the similar constituent elements to the ones in FET 10 shown in FIG. 1.

A HBT 30 illustrated in FIG. 3 includes a conductive SiC base 1, an AlN underlayer 2 epitaxially grown on the SiC base 1, and a first conductive layer 13 of a first conduction type made of n-GaN which is epitaxially grown on the underlayer 2. Moreover, the HBT 30 includes a second conductive layer 14 of the first conduction type made of n$^+$-GaN which is epitaxially grown on the first conductive layer 13, a third conductive layer 15 of a second conduction type made of p$^+$-GaN which is epitaxially grown on the second conductive layer 14, and a fourth conductive layer 16 of the first conduction type made of n$^+$-AlGaN which is epitaxially grown on the third conductive layer 15.

Therefore, the HBT 30 illustrated in FIG. 3 is constructed of a semiconductor element of npn type junction. In this embodiment, the first through the fourth conductive layers are classified in a semiconductor nitride layer group.

On the exposed surface of the first conductive layer 13 is formed a collector electrode 18 made of a Ti/Al/Pt/Au multilayered structure, and on the exposed surface of the third conductive layer 15 is formed a base electrode 17 made of a Ni/Pt/Au multilayered structure. Moreover, on the fourth conductive layer 16 is formed an emitter electrode 19 made of a Ti/Al/Pt/Au multilayered structure.

In those electron devices shown in FIGS. 1–3, it is required that the resistivities of the conductive SiC base 1 are set within the above-mentioned range. Also, the thickness of the underlayer 2 is preferably set to 0.5 μm. Moreover, in order to prevent the creation of crack through the mitigation of a tensile stress in the underlayer 2 which is created during the formation of the underlayer 2, the Al content of underlayer 2 is preferably varied continuously or stepwisely toward the conductive layer 3 or 13 from the conductive SiC base 1.

EXAMPLES

This invention will be concretely described, hereinafter.

Example 1

A conductive SiC base (resistivity=0.05 Ω·cm) having a diameter of 2 inches and a thickness of 330 μm was employed, and thus, pre-treated in a given chemical solution, and set into a MOCVD apparatus. To the MOCVD apparatus was attached a gas system of NH$_3$, TMA, TMG and SiH$_4$. Then, the pressure in the MOCVD apparatus was set to a pressure of 15 Torr, and the SiC base was heated to 1200° C. with flowing a H$_2$ carrier gas at a flow rate of 3 m/sec. Then, a TMA and an NH$_3$ gas were supplied onto the SiC base at a flow ratio of TMA:NH3=1:450, to epitaxially grow an AlN layer as an underlayer in a thickness of 2 μm.

Thereafter, the pressure in the MOCVD apparatus was set to a pressure of 100 Torr and the SiC base was heated to 1050° C. Then, a TMG and a NH$_3$ gas were supplied onto the AlN layer at a total average flow rate of 1.5 n/sec, to epitaxially grow an i-GaN layer in a thickness of 2 μm. In this case, the flow ratio of the TMG and the NH$_3$ gas was set to TMG:NH$_3$=1:1500. Thereafter, a SiH$_4$ was supplied in addition to the TMG and the NH$_3$ gas, to epitaxilly grow an n-GaN layer in a thickness of 30 nm.

Then, on the n-GaN layer are formed a source electrode and a drain; electrode which are made of a Ti/Al/Pt/Au multilayered structure and a gate electrode which is made of a Ni/Pt/Au multilayered structure. The gate length and the gate width were set to 0.5 μm and 70 μm, respectively.

When the high frequency performance and the output performance of the thus obtained FET were investigated, they were not almost deteriorated during the continuous use of the FET. The cut-off frequency ft of the FET was 30 GHz. Therefore, it was turned out that the FET has good high frequency performance and output performance.

Example 2

The same conductive SiC base was employed, and then, an AlN underlayer and an i-GaN layer were epitaxially grown in the same manner as in Example 1. Then, the SiC base was heated to 1120° C., and a TMA, a TMG, an NH$_3$ and SiH$_4$ were flown at a total average flow rate of 3 m/sec, to epitaxially grow an n-Al$_{0.2}$Ga$_{0.8}$N layer in a thickness of 30 nm. In this case, the flow ratio of the NH$_3$, the TMA and the TMG were set to NH$_3$:TMA:TMG=7500:1:5.

Thereafter, on the n-AlGaN were formed a source electrode and a drain electrode which are made of a Ti/Al/Pt/Au multilayered structure and a gate electrode which is made of a Ni/Pt/Au multilayered structure. The gate length and the gate width were set to 0.5 μm and 70 μm, respectively.

When the high frequency performance and the output performance of the thus obtained HEMT were investigated, they were not almost deteriorated during the continuous use of the HEMT. The cut-off frequency ft of the HEMT was 60 GHz. Therefore, it was turned out that the HEMT has good high frequency performance and output performance.

Comparative Example 1

Except that a sapphire single crystal base having a diameter of 2 inches and a thickness of 430 μm was employed instead of the conductive SiC base, a FET was fabricated in the same manner in Example 1. When the high frequency performance and the output performance of the thus obtained FET were investigated, they were deteriorated during the continuous use of the FET. The cut-off frequency ft of the FET was 10 GHz. Therefore, it was turned out that that the high frequency performance and the output performance of the FET are deteriorated due to the small thermal conductivity of the sapphire single crystal base.

Comparative Example 2

Except that a sapphire single crystal base having a diameter of 2 inches and a thickness of 430 μm was employed instead of the conductive SiC base, a HEMT was fabricated in the same manner in Example 2. When the high frequency performance and the output performance of the thus obtained HEMT were investigated, they were deteriorated during the continuous use of the HEMT. The cut-off frequency ft of the FET was 20 GHz. Therefore, it was turned out that that the high frequency performance and the output performance of the HEMT are deteriorated due to the small thermal conductivity of the sapphire single crystal base.

Example 3

Except that a GaN buffer layer was formed in a thickness of 0.05 μm at a low temperature of 600° C. instead of the AlN underlayer, a HEMT was fabricated in the same manner in Example 2. When the high frequency performance and the output performance of the thus obtained HEMT were investigated, they were not almost deteriorated during the continuous use of the HEMT. However, the cut-off frequency ft was only 10 GHz, so that the high frequency performance and the output performance of the HEMT are slightly deteriorated due to the conductivity.

Although the present invention was described in detail with reference to the above examples, this invention is not limited to the above disclosure and every kind of variation and modification may be made without departing from the scope of the present invention. For example, in the HEMT 20 illustrated in FIG. 2, a barrier layer made of i-AlGaN layer may be formed between the i-GaN layer 3 and the n-AlGaN layer 4. Although the HBT 30 illustrated in FIG. 3 is constructed of the semiconductor of npn-type junction, it may be of a semiconductor element of pnp type junction by reversing the conduction type of each layer constituting the semiconductor element.

As mentioned above, since the semiconductor element of the present invention is composed of the conductive SiC base which has a large thermal conductivity and is not expensive and the underlayer having large insulation made of Al-including semiconductor nitride on the SiC base. Therefore, the semiconductor element can have the originally designed performance index and then, can exhibit excellent output performance and high frequency performance.

What is claimed is:

1. A semiconductor element comprising:
   a conductive SiC base having a resistivity of less than $1 \times 10^5$ Ωcm,
   an underlayer made of a semiconductor nitride including at least Al element which is expitaxially grown on said SiC base, and
   a semiconductor nitride layer group made including at least one of Al element Ga element and In element expitaxially grown on the underlayer, wherein the thickness of said underlayer is set within 0.5–100 μm.

2. A semiconductor element as defined in claim 1, wherein Al content of said underlayer is set to 50 atomic percentages or over.

3. A semiconductor element as defined in claim 2, wherein said underlayer is made of AlN.

4. A semiconductor element as defined in claim 1, wherein said underlayer is made at 1100° C. or over by means of a CVD method.

5. A semiconductor element as defined in claim 4, wherein said underlayer is made at a temperature within 1100–1250° C. by means of the CVD method.

6. A semiconductor element as defined in claim 1, wherein the composition of said underlayer is varied continuously or stepwisely toward said semiconductor nitride layer group from said SiC base.

7. A semiconductor element as defined in claim 1 which has a warping degree of 100 μm or below per 5 cm length.

8. A field-effect transistor comprising a semiconductor element as defined in claim 1, a source electrode, a drain electrode and a gate electrode which are provided on said semiconductor element.

9. A high electron mobility transistor comprising a semiconductor element as defined in claim 1, a source electrode, a drain electrode and a gate electrode which are provided on said semiconductor element.

10. A heterojunction bipolar transistor comprising a semiconductor element as defined in claim 1, an emitter electrode, a base electrode and a collector electrode which are provided on said semiconductor element.

11. An epitaxial substrate comprising:
    a conductive SiC base having a resistivity of less than $1 \times 10^5$ Ωcm, and
    an underlayer made of a semiconductor nitride including at least Al element which is expitaxially grown on said SiC base, wherein the thickness of said underlayer is set within 0.5–100 μm.

12. An epitaxial substrate as defined in claim 11, wherein Al content of said underlayer is set to 50 atomic percentages or over.

13. An epitaxial substrate as defined in claim 12, wherein said underlayer is made of AlN.

14. An epitaxial substrate as defined in claim 11, wherein said underlayer is made at 1100° C. or over by means of a CVD method.

15. An epitaxial substrate as defined in claim 14, wherein said underlayer is made at a temperature within 1100–1250° C. by means of the CVD method.

* * * * *